US007999569B2

(12) United States Patent
Anderson

(10) Patent No.: US 7,999,569 B2
(45) Date of Patent: Aug. 16, 2011

(54) EDGE RATE SUPPRESSION FOR OPEN DRAIN BUSES

(75) Inventor: Alma Stephenson Anderson, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/630,453

(22) Filed: Dec. 3, 2009

(65) Prior Publication Data
US 2011/0133771 A1 Jun. 9, 2011

(51) Int. Cl.
H03K 17/16 (2006.01)
H03K 19/003 (2006.01)

(52) U.S. Cl. ............... 326/30; 326/81; 326/87; 327/24; 327/112; 327/170; 327/333; 710/105; 710/305

(58) Field of Classification Search ............ 326/30, 326/82–83, 86–87; 327/24, 108–109, 112, 327/170; 710/105
See application file for complete search history.

(56) References Cited

U.S. PATENT DOCUMENTS

| | | | | |
|---|---|---|---|---|
| 5,021,691 A * | 6/1991 | Saito | .............. | 326/69 |
| 5,539,341 A * | 7/1996 | Kuo | .............. | 327/108 |
| 5,557,223 A * | 9/1996 | Kuo | .............. | 327/108 |
| 5,818,260 A * | 10/1998 | Kuo | .............. | 326/86 |
| 5,877,634 A | 3/1999 | Hunley | | |
| 5,883,531 A * | 3/1999 | Kuo | .............. | 327/108 |
| 6,173,350 B1 * | 1/2001 | Hudson et al. | .............. | 710/100 |
| 7,733,142 B2 * | 6/2010 | Anderson et al. | .............. | 327/170 |
| 2003/0107909 A1 * | 6/2003 | Nakamura | .............. | 365/63 |
| 2008/0164932 A1 * | 7/2008 | Welty | .............. | 327/333 |
| 2009/0206875 A1 * | 8/2009 | Tran et al. | .............. | 326/38 |
| 2009/0243695 A1 * | 10/2009 | Thoma | .............. | 327/333 |
| 2010/0064088 A1 * | 3/2010 | Stephens et al. | .............. | 710/305 |

FOREIGN PATENT DOCUMENTS

WO 02/15401 A2 2/2002
WO 2006/090344 A1 8/2006

OTHER PUBLICATIONS

Extended European Search Report for European Patent Appln. No. 10193434.7 (May 3, 2011).

* cited by examiner

*Primary Examiner* — Jason M Crawford

(57) ABSTRACT

An edge rate suppression circuit arrangement is provided for operation with an open drain bus. The circuit arrangement includes a variable resistive circuit having an input for receiving a variable voltage signal and an output coupled to the open drain bus, and a control circuit configured to operate the variable resistive circuit. The control circuit operates the variable resistive circuit in respective high and low resistance states in response to the variable voltage signal.

19 Claims, 2 Drawing Sheets

EDGE RATE SUPPRESSION FOR OPEN DRAIN BUSES

FIELD OF THE INVENTION

The present invention relates generally to edge rate suppression for communications busses, and more specifically, to edge rate suppression in an open drain bus.

BACKGROUND

An open drain bus, such as an Inter-Integrated Circuit bus, a System Management Bus (SMBus) and others, includes a data line and a clock line. The Inter-Integrated Circuit bus is often referred to as an IIC, I2C or I$^2$C bus, and is hereinafter referred to as an I2C bus. The data line and the clock line can each be referred to individually as a bus line, or simply as a line. Each of the bus lines is connected to a pull-up resistor, interface devices and a capacitance representing distributed capacitance of the bus line and the total input capacitance of the connected interface devices. The data transfer rate depends upon the speed at which the resistor can charge the capacitance.

I2C buses are used in a variety of implementations, including those involving servers and computers, with applications including system monitoring and configuration. However, the I2C pins on certain devices, such as processors and ASICS, often use GPIO pins with high drive strength and no edge rate control. These approaches can result in problems with overshoot and noise, as may be applicable, for example, to falling rates at transitions that are less than the round trip time for the I2C bus. Related issues may arise in connection with the reflection of waves off of the end of the bus, which can result in turning on of clamp/body diodes on parts distributed along the bus. Other issues may also arise in compensating for fast transitions, as other characteristics of I2C bus communications can be affected, such as those limiting the voltage level that can be used to drive the bus to a logic low.

The implementation of various disparate devices with I2C busses, and of edge rate suppression for such devices, continues to be challenging in view of the above and other issues.

SUMMARY

The present invention is exemplified in a number of implementations and applications, some of which are summarized below.

Consistent with an example embodiment of the present invention, an edge rate suppression circuit arrangement is provided for operation with an open drain bus. The circuit arrangement includes a variable resistive circuit having an input for receiving a variable voltage signal and an output coupled to the open drain bus, and a control circuit configured to operate the variable resistive circuit. The control circuit operates the variable resistive circuit to switch from a high resistance state to a low resistance state in response to the variable voltage signal undergoing a transition from a high voltage level to a low voltage level. The control circuit further operates the variable resistive circuit to switch from the low resistance state to the high resistance state in response to the voltage signal undergoing a transition from a low voltage level to a high voltage level.

In another example embodiment, a communication system includes an I2C bus that includes a bi-directional serial data line and a serial clock line; devices coupled to communicate on the bus, a two-channel variable resistive circuit and a control circuit that controls the variable resistive circuit. The variable resistive circuit is configured to couple one of the devices to the bus, each channel respectively coupled to one of the bi-directional channels of the serial data line and having an input for receiving a variable voltage signal for the bus and an output coupled to the bus. The control circuit is configured to operate the variable resistive circuits to, for each circuit, switch the variable resistive circuit from a high resistance state to a low resistance state in response to the variable voltage signal undergoing a transition from a high voltage level to a low voltage level, and switch the variable resistive circuit from the low resistance state to the high resistance state in response to the voltage signal undergoing a transition from a low voltage level to a high voltage level.

Other example embodiments are directed to methods involving approaches such as those discussed above.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1:
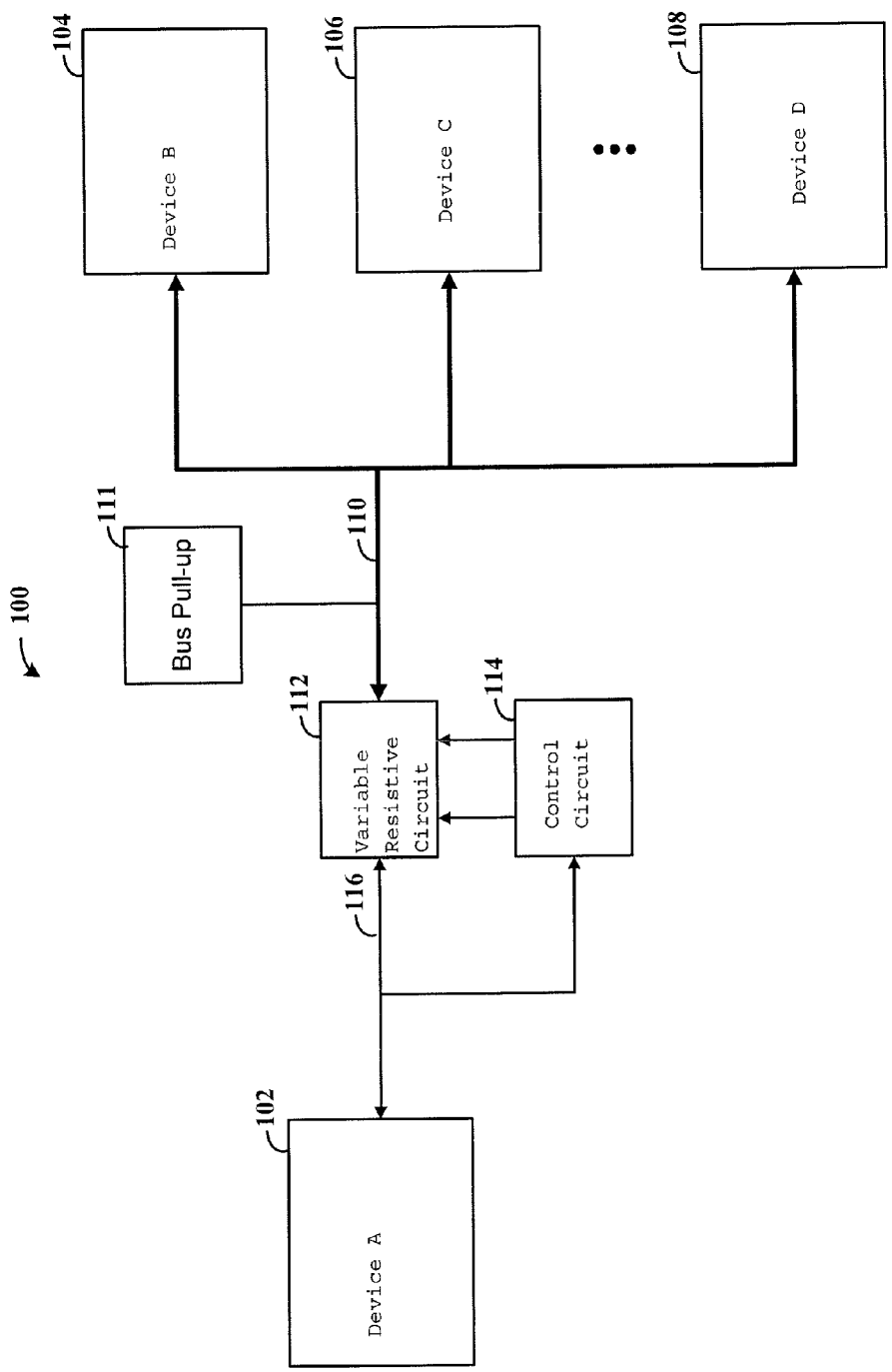
FIG. 1 shows a block diagram of a communications system, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the claims.

DETAILED DESCRIPTION

The present invention is believed to be applicable to a variety of different types of processes, devices and arrangements for use with an open drain bus. While the present invention is not necessarily so limited, various aspects of the invention may be appreciated through a discussion of examples using this context.

According to an example embodiment of the present invention, an edge rate suppression circuit operates with an open drain bus, such as an I2C bus having a bi-directional serial data line and a serial clock line. The circuit arrangement includes a variable resistive circuit that is connected in series between the open drain bus and one or more devices that communicate over the open drain bus, and operates at different resistance states to accommodate different types of devices that access the bus, and suppresses edge rates of voltage signals on the bus, as received from the devices in accordance with their respective bus access. The variable resistive circuit has an input for receiving a voltage signal from the devices communicating on the open drain bus, and an output coupled to the open drain bus.

A control circuit operates the variable resistive circuit at different resistance states, based upon transitions of incoming voltage signals, to control the edge rate for voltage transitions on the bus. For instance, in response to the voltage signal undergoing a transition from a high voltage level to a low voltage level, the control circuit switches the variable resistive circuit from a high resistance state to a low resistance state, which can be used to reduce (e.g., minimize) the voltage level required to drive the bus low (VOL). In response to the incoming voltage signal undergoing a transition from the low voltage level to the high voltage level, the control circuit switches the variable resistive circuit from the low resistance state to the high resistance state to prepare for a subsequent transition from high to low voltage.

According to another example embodiment of the present invention, an I2C bus arrangement includes an edge rate suppression circuit that facilitates non-I2C compliant communications. Generally, the I2C bus circuit is configured for effecting control and monitoring functions in a computer circuit, such as a computer and/or computer server, some of which are not completely compliant with the I2C specification (see, e.g., Version 3 of the I2C specification (19 Jun. 2007), available from NXP Semiconductors of Eindhoven, The Netherlands, which is fully incorporated herein by reference). The edge-rate suppression circuit suppresses the edge rate of voltage transitions for the non-compliant communications, to permit use of the I2C bus by various devices, such as those employing general-purpose input/outputs (GPIOs) to drive the I2C bus at relatively high drive strength.

In one implementation, an advanced process part such as a processor or application-specific integrated circuit (ASIC) uses a GPIO to drive the I2C bus, and the edge-rate suppression circuit is used on the I2C bus to control the edge rate of voltage signals on the bus, responsive to the output drive strength of the GPIO. The edge-rate suppression circuit slows down the falling edge seen by other parts on the bus to reduce and/or otherwise minimize undershoot and noise problems. In one implementation, the edge-rate suppression circuit is configured to provide higher resistance during the falling (high-to-low) transition of a voltage signal, and then to provide a low resistance after the falling edge.

In connection with the above and other embodiments as described herein, the respective variable resistance transitions may be carried out in different manners, relative to the respective voltage signal supplied to the bus. For instance, the variable resistance may be adjusted from low to high resistance immediately responsive to, or after a delay period subsequent to, a transition of an incoming voltage signal from low to high voltage. Similarly, the resistance may be adjusted from high to low concurrent with, or at some delay period after, a transition of an incoming signal from high to low voltage.

According to a further example embodiment of the present invention, an adaptive/variable resistor at an input to an I2C bus is operated at a relatively high resistance value for a high to low voltage transition, at a lower resistance value after the transition in order to reduce (e.g., minimize) static VOL, and again at a higher value on a low to high voltage transition to prepare for a subsequent high to low voltage transition, relative to the capacitance of the I2C bus. The adaptive/variable resistor has an RC rise time that is set via the resistance state of the resistor to control the edge rate transition of incoming voltage signals as seen on the bus, which may be used to permit operation of various disparate circuits on the bus, including relatively low-power circuits and relatively high-power circuits, in accordance with different protocols.

Turning now to the figures, FIG. 1 shows a block diagram of a communications system, according to another example embodiment of the present invention. The system 100 includes a plurality of devices 102, 104, 106 and 108 that are connected together via an I2C bus 110 and that communicate with each other over the I2C bus. As represented by the ellipsis between devices 106 and 108, the number of devices communicating on the bus may vary, with the shown devices provided by way of example for this discussion.

The I2C bus 110 passes communications between the devices 102-108 using a bi-directional two-wire bus (plus power and ground). The devices 102-108 are connected to each of the two wires on the bus 110, one serial data line (SDA) for the communication of data, and the other serial clock line (SCL) for the control and synchronization of the communication of data between the devices 102-108. Each of the devices 102-108 is connected in parallel to each of the other devices, and each of the bus lines (SDA and SCL) function as a wired-AND of all the parts on the bus.

When one or more of the devices 102-108 is configured as an open-collector/open-drain device, and a pull-up resistive circuit 111 maintains a logic high value on the bus while the bus is in the quiescent state. When a device desires access to the bus, the device pulls the bus to a logic low value, via the open-collector/open-drain device that is placed in a conductive state to ground potential.

The devices 102-108 connected to an I2C bus are each identifiable by an address, and can operate as a transmitter, a receiver, or both. Data transfers are effected using a master-slave communications protocol. A master is a device that initiates a data transfer and generates the clock signals to permit the transfer; any device that is addressed is considered a slave for this transfer. The data transfer can be initiated by a master to either transmit data to the slave (herein designated as write), or to request data from the slave (herein designated as read).

In a quiescent state, both the SDA and SCL bus lines are in the logic-high state (herein designated as high, or logic state of 1). A master initiates a data transfer by asserting a transition to a logic-low state (herein designated as low, or logic state of 0) on the SDA line while the SCL line is high; this is termed a START condition. Thereafter, the master toggles the SCL line to control the synchronization of the data transfer; data value changes occur on the SDA line when the SCL clock is low, and the state of the SDA line is considered valid when the SCL clock is high. To terminate the data transfer, the master asserts a low-to-high transition on the SDA line while the SCL clock is high; this is termed a STOP condition. Thereafter, any device may assume control of the bus as a master by asserting a high-to-low transition on the SDA line, as above.

In one embodiment, the device 102 is a processor that uses a GPIO master device to drive the I2C bus 110 at a relatively high voltage level. A variable resistive circuit 112 is connected in series between the device 102 and the I2C bus 110. A control circuit 114 controls the variable resistive circuit 112 responsive to transitions of the voltage level of the bus I2C bus 110 which the device 102 drives in a manner such as described above, to control the edge rate of falling (high-to-low) transitions on the bus. In some implementations, the variable resistive circuit 112 is placed in close proximity to the device 102 to mitigate transmission line effects on the signal 116 while the variable resistive circuit slows the falling edge on the I2C bus 110.

The control circuit 114 controls the variable resistive circuit 112 to effect edge rate control in one or more of a variety of manners. In one implementation, the control circuit 114 controls the resistive circuit 112 at high and low resistive values, to maintain a high value for high-to-low transitions. In this context, the control circuit 114 sends a signal to the variable resistive circuit 112 to switch the variable resistive circuit 112 from a high resistance state to a low resistance state in response to the signal 116 undergoing a transition from a high voltage level to a low voltage level. The control circuit 114 sends a signal to the variable resistive circuit 112 to switch the variable resistive circuit 112 from the low resistance state to the high resistance state in response to the signal 116 undergoing a transition from a low voltage level to a high voltage level, in preparation for a subsequent high-to-low transition.

In one implementation, the control circuit 114 is also configured to operate the variable resistive circuit 112 by maintaining the variable resistive circuit 112 in its present resistance state between voltage transitions. For example, the control circuit 114 maintains the variable resistive circuit 112 in the low resistance state from a high to a low transition until the next low to high transition and the control circuit 114 maintains the variable resistive circuit 112 in the high resistance state from a low to a high transition until the next high to low transition.

In some embodiments, the variable resistive circuit 112 operates to pull up the bus 116. For example, if device 102 is a low voltage device having an open drain output, the variable resistive circuit 112 can provide both falling edge rate control and level translation as described herein. With these embodiments, the system 100 may be operated using variable resistive circuit 112 in connection with, or separate from, the pull-up resistive circuit 111.

Figure 2:
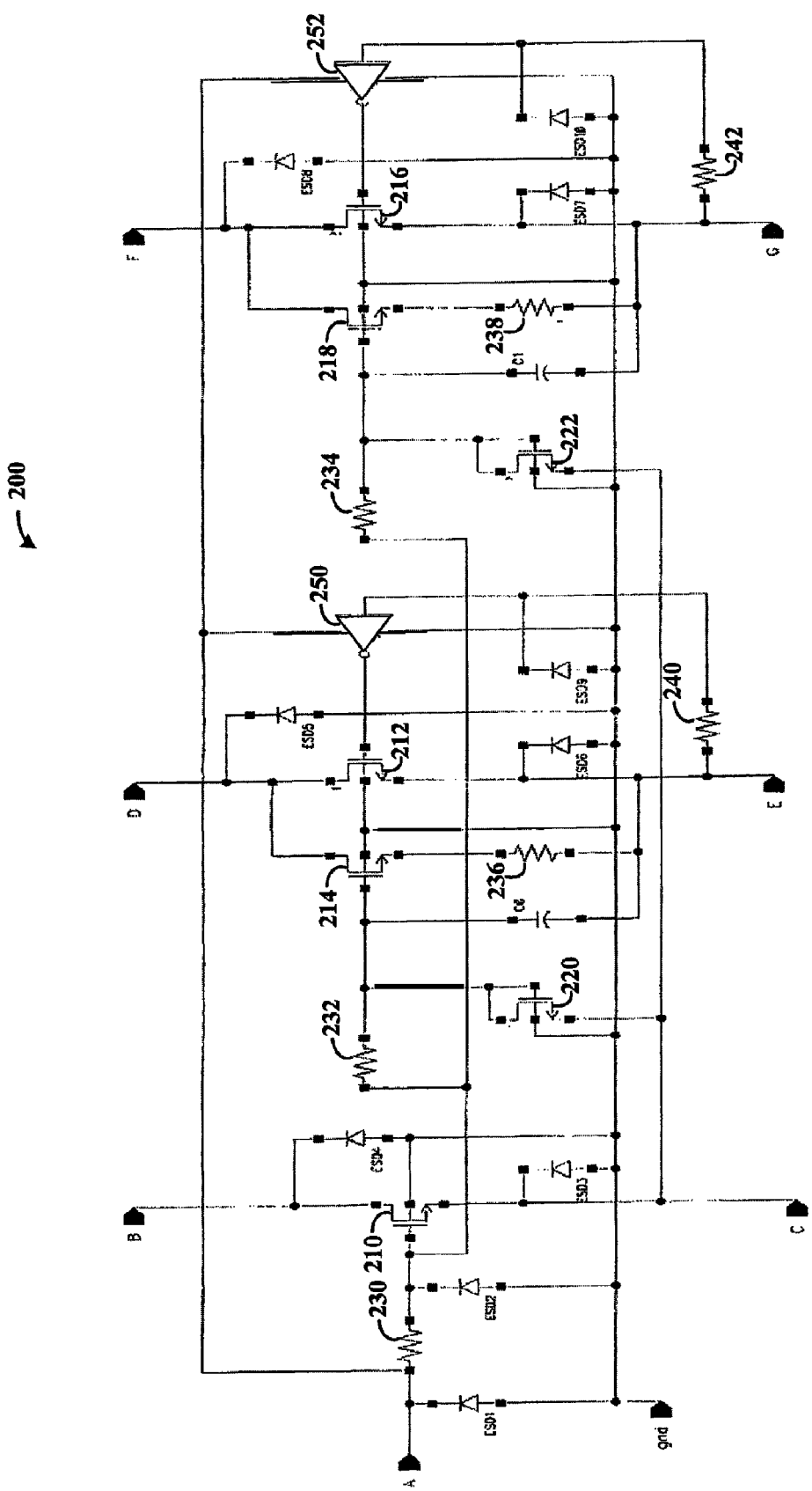
FIG. 2 shows a circuit diagram of a two-channel level shifter, according to another example embodiment of the present invention.

FIG. 2 shows circuit diagram of a two-channel level shifter circuit 200 that incorporates edge rate suppression, according to another example embodiment of the present invention. The two-channel level shifter 200 includes terminals A, B, C, D, E, F, G, and ground (gnd). The ground terminal is connected to the substrate of a chip upon which the shifter circuit is implemented, to back gates of NMOS transistors on the chip, and to the source connection for NMOS transistors used in control logic 250 and 252.

The two-channel level shifter 200 includes two translation channels. The first translating channel, formed by transistors 212 and 214 and resistor 236, is connected between terminals D and E. The second translation channel, formed by transistors 216 and 218 and resistor 238, is connected between terminals F and G.

The two-channel level shifter 200 also includes an NMOS transistor 210 that is connected between terminals B and C and that is used as a reference transistor to bias terminals A and B to a threshold above a low voltage that is connected to terminal C (the source of transistor 210). The gates of the NMOS transistors are biased to a threshold above the voltage on terminal C by a conductor that connects terminal C to a low voltage power-supply, in response to a bias applied to the A and B terminals through an external resistor, by a power supply that is at a level of at least a threshold above the low voltage supply. The two translation channels (D, E and F, G) are used to provide a level shift between signals in the low voltage domain to signals in the high voltage domain. For example, if the logic in both domains is open drain, high logic levels are provided in both power supply domains and the signals are bidirectional (as in the case of an I2C bus). The transistor 212 acts like a low resistance connection between the terminals D and E as the terminal voltages approach the reference voltage on terminal C, with the gate-to-source voltage of the transistor 212 approaching the threshold of the reference transistor 210 and the channel resistance increasing rapidly as the transistor 212 turns off.

The two-channel level shifter 200 further includes electrostatic discharge (ESD) protection circuitry that includes primary ESD protection devices (ESD1, ESD3, ESD4, ESD5, ESD6, ESD7 and ESD8) and secondary ESD protection devices (ESD2, ESD9, and ESD10). Terminal A is connected to a primary ESD protection device ESD1, to a series resistor 230, to the sources of the PMOS transistors and to the back gates in the control logic 250 and 252. The resistor 230 connects terminal A to the gate of the reference transistor 210, to the secondary ESD protection device ESD2, to resistor 232 and to resistor 234.

Turning again to the first translating channel formed by transistors 212 and 214 and resistor 236 and related variable resistance control. A control circuit for transistor 214 is formed by resistor 232, transistor 220 and coupling element C0. The resistor 232, the transistor 220, and the coupling element C0 form the control circuit for transistor 214.

In one implementation, the coupling element C0 reduces or minimizes the dynamic change in the gate to terminal E voltage during a fast high to low transition on terminal E, thereby reducing the change in resistance of the path between terminals D and E formed by the series combination of resistor 236 and transistor 214. The transistor 220 acts as a clamp during low to high transitions, thereby preventing the gate of transistor 220 from overshooting (e.g., as compared to the low reference voltage on terminal C plus a threshold nominal operating point). The resistor 232 acts as a recharge element by slowly returning the gate of the transistor 214 to the correct operating point after a high to low transition on terminal E. In one implementation, the connection from terminal D to terminal E through transistor 214 and resistor 236 is always active during a high to low transition.

The transistor 212 forms a parallel path between terminals D and E after the high to low transition to reduce/minimize the static low. The gate control circuit for the transistor 212 is formed by resister 240, secondary ESD protection device ESD9 and control logic block 250. The control logic 250 is an inverting function that pulls the gate of the transistor 212 up to the low reference voltage on terminal C, plus a threshold bias voltage after the input goes low. The control logic 250 also pulls the gate to ground when the input (terminal E) is high.

In one implementation, the control logic block 250 effects a low feed-through current when the terminal E is high, and charges the gate of transistor 212 slowly when switching to the low-resistance state. For example, a multiple stage inverting buffer (e.g., 3, 5, or 7 stages) can be used with long gate length devices to reduce/minimize current.

In another implementation, the control logic 250 turns the transistor 212 on gradually after the terminal E is low. In addition, the control logic 250 turns the transistor 212 off quickly enough after terminal E goes high so that the transistor 212 is off before the next high to low transition (e.g., where any relative time period is set based upon specific circuit conditions). In some implementations, the parallel transistor 212 is turned on or off at a time period that is not less than about 60 nanoseconds, and corresponding switched by about 120 nanoseconds, which times can be tailored to specific operating ranges.

The second translation channel (transistors 216 and 218 and resistor 238) functions in the same manner as the first translation channel. The control circuit for transistor 218 is formed by resistor 234, transistor 222 and coupling element C1. The terminals F and G are connected by the series connection of transistor 218 and resistor 238 in parallel with transistor 216. The gate control circuit for transistor 216 is formed by resistor 242, which is connected between terminal G, secondary ESD protection device ESD10, and the input of control logic block 252. The gate of the transistor 216 is connected to the output of the control logic 252, which functions in the same manner as control logic 250.

While the present invention has been described above and in the claims that follow, those skilled in the art will recognize that many changes may be made thereto without departing from the spirit and scope of the present invention.

What is claimed is:

1. An edge rate suppression circuit for operation with an open drain bus, the circuit comprising:
   a variable resistive circuit having an input for receiving a variable voltage signal and an output coupled to the open drain bus having a translation circuit configured to provide a level shift between a signal in a low voltage domain to a signal in a high voltage domain; and
   a control circuit configured to operate the variable resistive circuit by
      switching the variable resistive circuit from a high resistance state to a low resistance state in response to the variable voltage signal undergoing a transition from a high voltage level to a low voltage level, and
      switching the variable resistive circuit from the low resistance state to the high resistance state in response to the voltage signal undergoing a transition from a low voltage level to a high voltage level.

2. The circuit of claim 1, wherein
   the variable resistive circuit includes a low-resistance circuit path and a high-resistance circuit path, and
   the control circuit is configured to switch the variable resistive circuit from a high resistance state to a low resistance state by activating the low-resistance circuit path, and to switch the variable resistive circuit from the low resistance state to the high resistance state by activating the high-resistance circuit path.

3. The circuit of claim 1, wherein
   the variable resistive circuit includes a two-channel level shifter circuit, each channel including a low-resistance circuit path and a high-resistance circuit path and each channel respectively coupled to one of two bi-directional channels on the bus, and
   the control circuit is configured to switch the variable resistive circuit from a high resistance state to a low resistance state by activating at least one of the low-resistance circuit paths, and to switch the variable resistive circuit from the low resistance state to the high resistance state by deactivating at least one of the low-resistance circuit paths.

4. The circuit of claim 1, wherein
   the variable resistive circuit includes
      a low-resistance circuit having a transistor that couples terminals for passing signals in a low resistance state, and
      a high-resistance circuit having a transistor and a resistor, the transistor being configured to couple the terminals for passing signals via the resistor in a high resistance state, and
   the control circuit is configured to
      switch the variable resistive circuit from a high resistance state to a low resistance state by turning the transistor in the low-resistance circuit on to couple the terminals via the transistor in the low-resistance circuit, and
      switch the variable resistive circuit from the low resistance state to the high resistance state by turning the transistor in the low-resistance circuit off.

5. The circuit of claim 1, wherein
   the variable resistive circuit includes
      a low-resistance circuit having a transistor that couples terminals for passing signals in a low resistance state, and
      a high-resistance circuit having a transistor and a resistor, the transistor being configured to couple the terminals for passing signals via the resistor in a high resistance state, and
   the control circuit is configured to
      switch the variable resistive circuit from a high resistance state to a low resistance state by applying a gradual bias to the gate of the transistor in the low-resistance circuit to slowly turn the transistor on, and
      switch the variable resistive circuit from the low resistance state to the high resistance state by turning the transistor in the low-resistance circuit off to effect a low feed-through current.

6. The circuit of claim 1, wherein
   the variable resistive circuit includes
      a low-resistance circuit having a transistor that couples terminals for passing signals in a low resistance state, and
      a high-resistance circuit having a transistor and a resistor, the transistor being configured to couple the terminals for passing signals via the resistor in a high resistance state, and
   the control circuit is configured to
      switch the variable resistive circuit from a high resistance state to a low resistance state by turning the transistor in the low-resistance circuit on to couple the terminals via the transistor in the low-resistance circuit, and
      switch the variable resistive circuit from the low resistance state to the high resistance state by turning the transistor in the low-resistance circuit off within a time period that is less than a transition time period between high and low voltage signals passed on the bus.

7. The circuit of claim 1, wherein
   the variable resistive circuit includes a low-resistance circuit path and a high-resistance circuit path, and
   the control circuit is configured to
      switch the variable resistive circuit from a high resistance state to a low resistance state by activating the low-resistance circuit path and maintaining the high resistance path active during the transition from the high resistance state to the low resistance state at which the low-resistance circuit path is active, and
      switch the variable resistive circuit from the low resistance state to the high resistance state by activating the high-resistance circuit path.

8. The circuit of claim 1, wherein the control circuit is configured to switch the variable resistive circuit between the high and low resistance states in response to a variable voltage signal on the bus.

9. The circuit of claim 1, further including an electrostatic discharge (ESD) protection circuit that is configured to discharge electrostatic energy in the circuit.

10. The circuit of claim 1, wherein the variable resistive circuit is located in series between the device and the bus and is configured to control the edge rate of a signal on the open drain bus as the bus is driven by a device that is coupled to the bus.

11. The circuit of claim 1, wherein the control circuit is further configured to operate the variable resistive circuit by maintaining the variable resistive circuit in a steady resistance state between voltage transitions.

12. The circuit of claim 1, wherein the variable resistive circuit and the control circuit are integrated in a single circuit.

13. An edge rate suppression circuit for operation with an open drain bus, the circuit comprising:

a variable resistive circuit having an input for receiving a variable voltage signal and an output coupled to the open drain bus; and a control circuit configured to operate the variable resistive circuit by switching the variable resistive circuit from a high resistance state to a low resistance state in response to the variable voltage signal undergoing a transition from a high voltage level to a low voltage level, and switching the variable resistive circuit from the low resistance state to the high resistance state in response to the voltage signal undergoing a transition from a low voltage level to a high voltage level, wherein the variable resistive circuit includes a low-resistance circuit having a transistor that couples terminals for passing signals in a low resistance state, and a high-resistance circuit having a transistor and a resistor, the transistor being configured to couple the terminals for passing signals via the resistor in a high resistance state, and the control circuit includes an inverter circuit configured to switch the variable resistive circuit from a high resistance state to a low resistance state by pulling the gate of the transistor in the low-resistance circuit to a voltage level that is a detected reference voltage of the circuit plus a threshold voltage to operate the transistor in response to a low input voltage, and switch the variable resistive circuit from the low resistance state to the high resistance state by pulling the gate of the transistor in the low-resistance circuit to ground in response to a high input voltage.

14. An edge rate suppression circuit for operation with an open drain bus, the circuit comprising:

a variable resistive circuit having an input for receiving a variable voltage signal and an output coupled to the open drain bus; and a control circuit configured to operate the variable resistive circuit by switching the variable resistive circuit from a high resistance state to a low resistance state in response to the variable voltage signal undergoing a transition from a high voltage level to a low voltage level, and switching the variable resistive circuit from the low resistance state to the high resistance state in response to the voltage signal undergoing a transition from a low voltage level to a high voltage level, wherein the open-drain bus is an I2C bus operating on I2C standards, and wherein the control circuit is configured to control access to the bus by non-I2C compliant devices by controlling the variable resistive circuit to operate in the high resistance state in response to a non-I2C compliant device driving the I2C bus.

15. A communication system comprising:

an I2C bus that includes a bi-directional serial data line and a serial clock line;

a plurality of devices coupled to the bus and configured to communicate with each other over the bus via a communications protocol;

a two-channel variable resistive circuit configured to couple one of the devices to the bus and configured to provide a signal translation by providing a level shift between a signal in a low voltage domain to a signal in a high voltage domain, each channel respectively coupled to one of the bi-directional channels of the serial data line and having an input for receiving a variable voltage signal for the bus and an output coupled to the bus; and a control circuit configured to operate the variable resistive circuits to, for each circuit, switch the variable resistive circuit from a high resistance state to a low resistance state in response to the variable voltage signal undergoing a transition from a high voltage level to a low voltage level, and switch the variable resistive circuit from the low resistance state to the high resistance state in response to the voltage signal undergoing a transition from a low voltage level to a high voltage level.

16. The system of claim 15, wherein each channel of the variable resistive circuit respectively includes a low-resistance channel having a transistor, and a high-resistance channel having a transistor in series with a resistor, and the control circuit is configured to switch the variable resistive circuit between high and low resistance states by respectively turning the transistor in the low-resistance channel off and on.

17. A method for edge rate suppression with an open drain bus, the method comprising:

in a control circuit, operating a variable resistive circuit having an input for receiving a variable voltage signal and an output coupled to the open drain bus by switching the variable resistive circuit from a high resistance state to a low resistance state in response to the variable voltage signal undergoing a transition from a high voltage level to a low voltage level, and switching the variable resistive circuit from the low resistance state to the high resistance state in response to the voltage signal undergoing a transition from a low voltage level to a high voltage level, wherein having a translation circuit configured to provide a level shift between a signal in a low voltage domain to a signal in a high voltage domain.

18. The method of claim 17, wherein the variable resistive circuit includes a low-resistance circuit path and a high-resistance circuit path, and operating the variable resistive circuit includes switching the variable resistive circuit from a high resistance state to a low resistance state by activating the low-resistance circuit path, and switching the variable resistive circuit from the low resistance state to the high resistance state by activating the high-resistance circuit path.

19. The method of claim 17, wherein the variable resistive circuit includes a low-resistance path coupled between two terminals by a first transistor, and a high-resistance path coupled between two terminals by a second transistor, and operating the variable resistive circuit includes for the low resistance state, controlling the first transistor in an on state and controlling the second transistor in an off state, and for the high-resistance state, controlling the first transistor in an off state and controlling the second transistor in an on state.

* * * * *